US006965177B2

(12) United States Patent
Turner et al.

(10) Patent No.: US 6,965,177 B2
(45) Date of Patent: Nov. 15, 2005

(54) PULSE DRIVE OF RESONANT MEMS DEVICES

(75) Inventors: Arthur Monroe Turner, Allen, TX (US); Andrew Steven Dewa, Plano, TX (US); Mark W. Heaton, Irving, TX (US); Philip A. Roden, Plano, TX (US); Carter Bruce Simpson, Celina, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/868,334

(22) Filed: Jun. 15, 2004

(65) Prior Publication Data

US 2004/0256921 A1 Dec. 23, 2004

Related U.S. Application Data

(60) Provisional application No. 60/479,336, filed on Jun. 18, 2003.

(51) Int. Cl.[7] .................. H02K 33/00; H01L 21/00; G02B 26/00; G02B 26/08

(52) U.S. Cl. ........................................ 310/38; 310/36
(58) Field of Search .................. 310/36–39; 359/198, 359/224, 230

(56) References Cited

U.S. PATENT DOCUMENTS 6,538,799 B2 * 3/2003 McClelland et al. ........ 359/291
6,809,434 B1 * 10/2004 Duncan et al. ............... 310/12

* cited by examiner

*Primary Examiner*—Darren Schuberg
*Assistant Examiner*—Judson H. Jones
(74) *Attorney, Agent, or Firm*—William B. Kempler; W. James Brady, III; Frederick J. Telecky, Jr.

(57) ABSTRACT

System and method for establishing and maintaining resonant oscillations of a torsional hinged device such as a pivotally hinged mirror. The system and methods comprise a permanent magnet mounted to the pivoting mirror that interacts with an electromagnetic coil. The magnetic coil is periodically connected and disconnected from a DC power supply in response to a series of drive pulses having a timing and duration such that the magnetic forces generated by the interaction of the permanent magnet and the electromagnetic coil maintains resonant oscillations of the device.

32 Claims, 9 Drawing Sheets

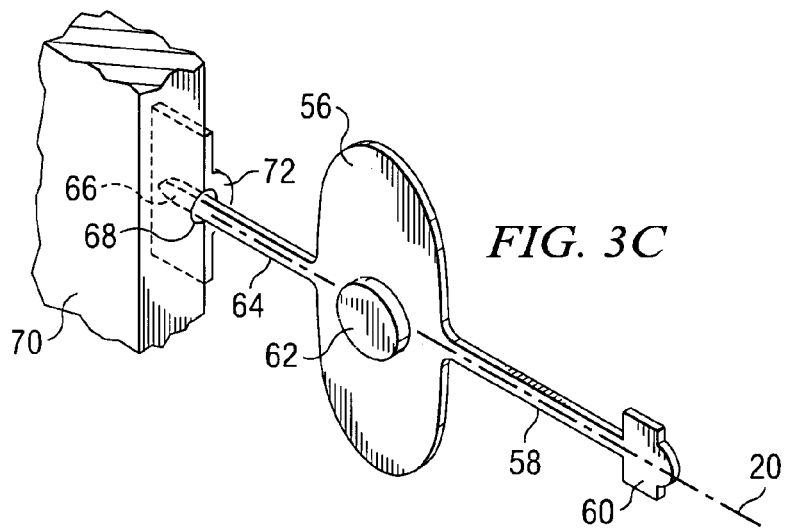
*FIG. 3C*
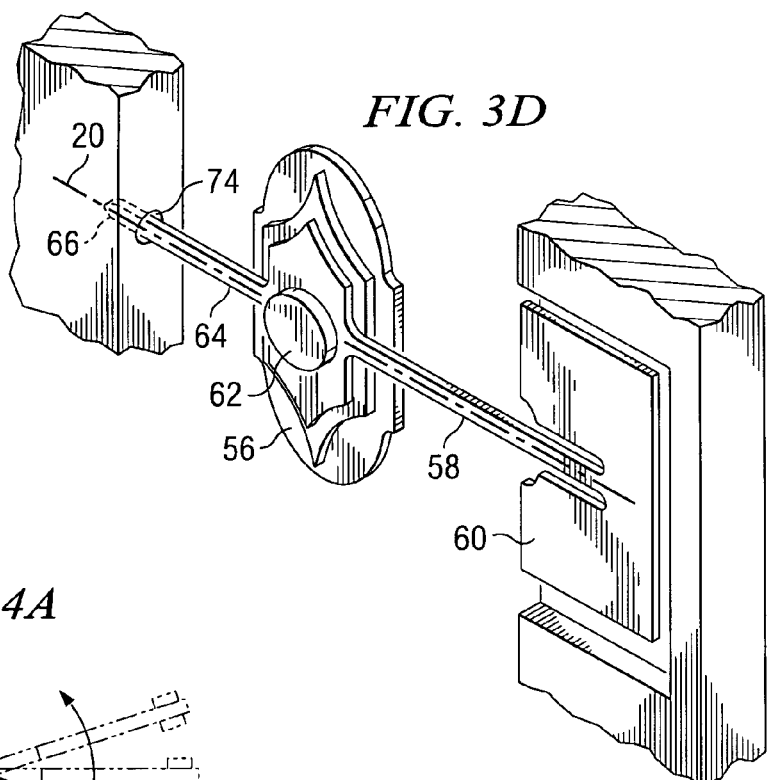
*FIG. 3D*
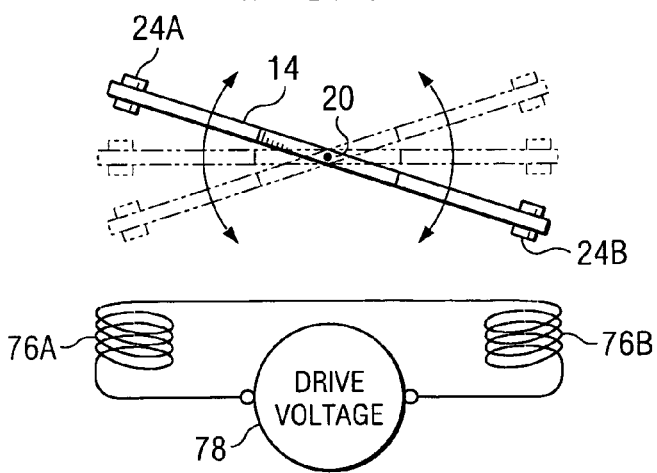
*FIG. 4A*
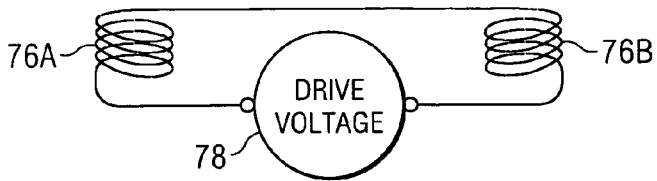

AC VOLTAGE (AMPLITUDE)

FREQUENCY NUMBER 3

PULSE DRIVE OF RESONANT MEMS DEVICES

This application claims the benefit of U.S. Provisional Application No. 60/479,336, filed on Jun. 18, 2003, entitled Pulse Drive of Resonant MEMS Devices, which application is hereby incorporated herein by reference.

TECHNICAL FIELD

The present invention relates generally to the field of torsional hinge MEMS oscillating devices. More particularly, the invention relates to a method and circuitry for initiating and maintaining resonant oscillation of a torsional hinged device such as a pivoting mirror for providing a scanning light beam used by a laser printer. According to this invention, the torsional hinged devices are economically driven by a train of electrical pulses rather than a bipolar electrical sine wave

BACKGROUND

Recently, inexpensive torsional hinged flat mirrors with a single reflective surface have gained acceptance as a reliable replacement scanning mirror for the much more expensive rotating polygon mirrors used in laser printers. Laser printers use a scanning mirror to provide a continuous sweep or scan of a modulated light source across a photosensitive medium such as a rotating drum. By designing the torsional hinged mirror to have a resonant frequency substantially at the desired scanning or sweep frequency of the laser beam, these torsional hinged mirrors are used in new generations of high-speed laser printers at a very advantageous cost.

Texas Instruments presently manufactures a large number of mirror MEMS devices fabricated or etched from a single piece of material (such as a silicon wafer for example) using semiconductor manufacturing processes. Before the mirror devices are etched, at least one surface (and usually both) of the silicon wafer is polished to provide the reflective surface of the mirror, which may have any suitable perimeter shape such as oval elongated elliptical, rectangular, square or other. Single axis mirrors include the reflective surface portion and a pair of torsional or full hinges, which extend to a support frame or alternately the hinges may extend from the mirror portion to a pair of hinge anchors. Other mirror embodiments use a single torsional hinge to eliminate hinge stress resulting from temperature changes and mounting stresses.

Although several types of drive techniques may be used to drive (i.e., initiate and maintain resonant oscillation of the mirror), various magnetic drives have been found to be especially suitable.

Generally, a magnetic drive suitable for use with such torsional hinged mirrors comprise one or more permanent magnets bonded or mounted on the pivoting structure portion of the mirror. One or more electromagnetic coil(s) is separated from, but is positioned proximate the permanent magnet. According to the prior art, a bipolar sine wave or electrical signal having a frequency substantially at the resonant frequency of the torsional hinged mirror device was applied across the electromagnetic coil(s) to initiate and maintain pivotal oscillation of the torsional hinged mirror at the resonant frequency.

Although the torsional hinged resonant mirror bipolar apparatus is inexpensive compared to rotating polygon mirrors, the sine wave type power supply having a frequency that can be calibrated to the resonant frequency of the mirror constitutes one of the more expensive items. Therefore, it would be still more advantageous to use an inexpensive and effective power supply and technique to drive the resonant torsional hinged device.

SUMMARY OF THE INVENTION

These and other problems are generally solved or circumvented, and technical advantages are generally achieved, by embodiments of the present invention, which provide an inexpensive and effective apparatus and methods for initiating and maintaining a torsional hinged device, such as a mirror, at its resonant frequency.

The apparatus and methods of the invention comprise a torsional hinged device, such as a mirror, adapted for pivoting about an axis at its resonant frequency. At least one permanent magnet is bonded or otherwise mounted to the mirror structure. The permanent magnet (either axial charged or diametrically charged) may be bonded along the pivotal axis to the backside of the mirror's reflecting surface. Alternately, a pair of magnets (or magnetic sets) may be mounted to the pivoting mirror structure on each side of the pivoting axis. One or more electromagnetic coil(s) are mounted on the structure that supports the pivoting mirror such that a magnetic field created by the coil of the apparatus interacts with the permanent magnet(s) to pivotally oscillate the mirror at its resonant frequency. The electromagnetic coil(s) are connected through switching circuitry to a DC power source that has a selected output voltage.

According to one embodiment, a monitor circuit determines the position of the oscillating mirror and generates a signal indicative of the mirror position. This signal is received at a control circuit, which then calculates the timing and duration of a series or train of pulses transmitted to the switching circuitry. The switching circuitry connects and disconnects the power source and the electromagnetic coil such that the magnetic energy developed at the coil interacts with the permanent magnet to maintain the resonant oscillation.

According to another embodiment, an H-Bridge Drive is connected between the power source and the electromagnetic coil(s) so that both positive and negative magnetic energy pulses may be generated at each end point (zero speed) as appropriate of the resonant oscillation cycle.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A through 3D illustrate the embodiments of single axis half torsional hinged mirror that can benefit from the teachings of the present invention;

FIGS. 4A, 4B, and 4C illustrate typical embodiments of drive mechanism suitable for use with the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Like reference number in the figures are used herein to designate like elements throughout the various views of the present invention. The figures are not intended to be drawn to scale and in some instances for illustrative purposes, the drawings may intentionally not be to scale. One of ordinary skill in the art will appreciate the many possible applications and variations of the present invention based on the following examples of possible embodiments of the present invention.

Figure 1A:
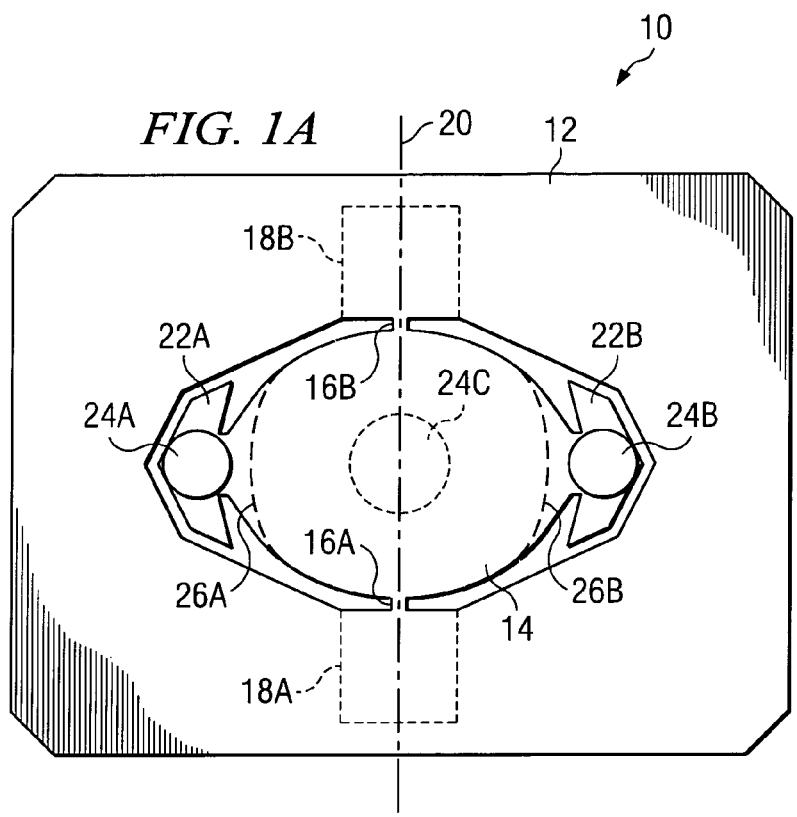
FIGS. 1A through 1D illustrate embodiments of single axis full torsional hinged mirrors that can benefit from the teachings of the present invention.

Referring now to the prior art FIG. 1A, mirror device 10 includes a functional surface, such as a reflective surface or mirror 14, supported by a pair of torsional hinges 16a and 16b. A frame member 12 or alternately, a pair of anchor pads 18a and 18b, supports the device 10 along a selected axis 20. According to one embodiment, the mirror device 10 may also include a pair of tabs 22a and 22b for supporting a pair of magnets 24a and 24b that interact with a magnet field generated by an electromagnetic coil to pivot the reflecting surface or mirror member 14 about selected axis 20. Alternately, the tabs may be omitted as indicated by dashed lines 26a and 26b and a single magnet 24c may be bonded to the backside of the pivoting reflecting surface 14 along the pivotal axis.

Figure 1B:
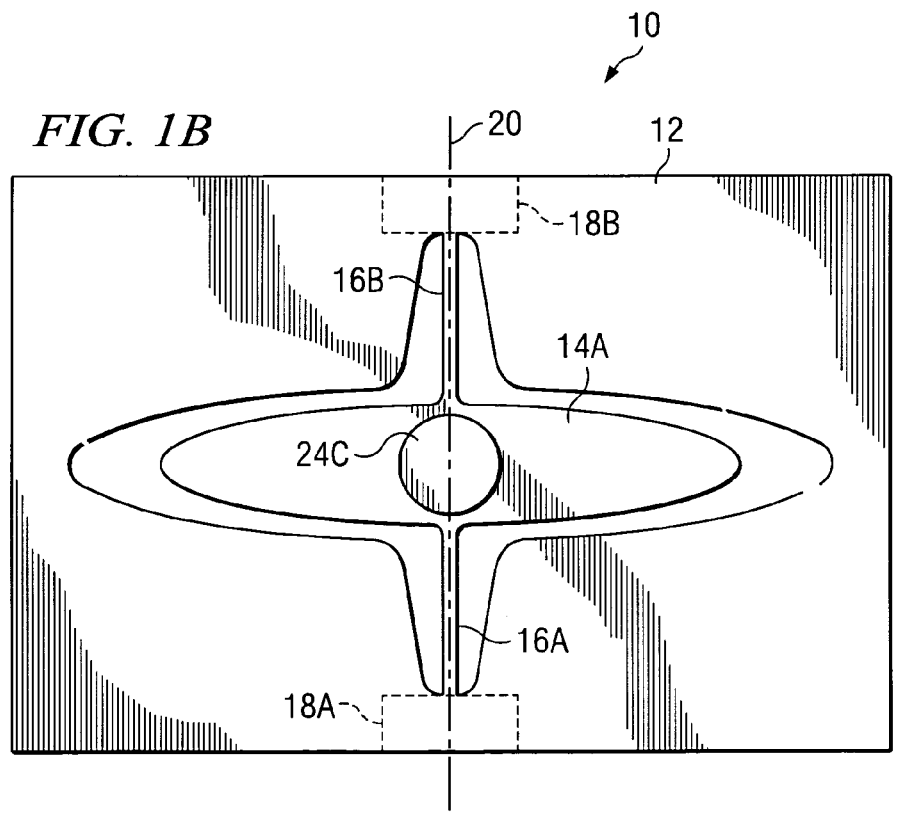

Referring now to FIG. 1B, there is shown another embodiment of a typical single axis mirror device. The mirror shown in FIG. 1B is substantially similar to that shown in FIG. 1A except the mirror portion 14a has a long elliptical shape. Consequently, FIG. 1B uses the same reference number as FIG. 1A to identify similar components of the mirror. The mirror of FIG. 1B could be driven by permanent magnets attached to the tips of the elongated ellipse, but is shown with a center magnet 24C.

Figure 1C:
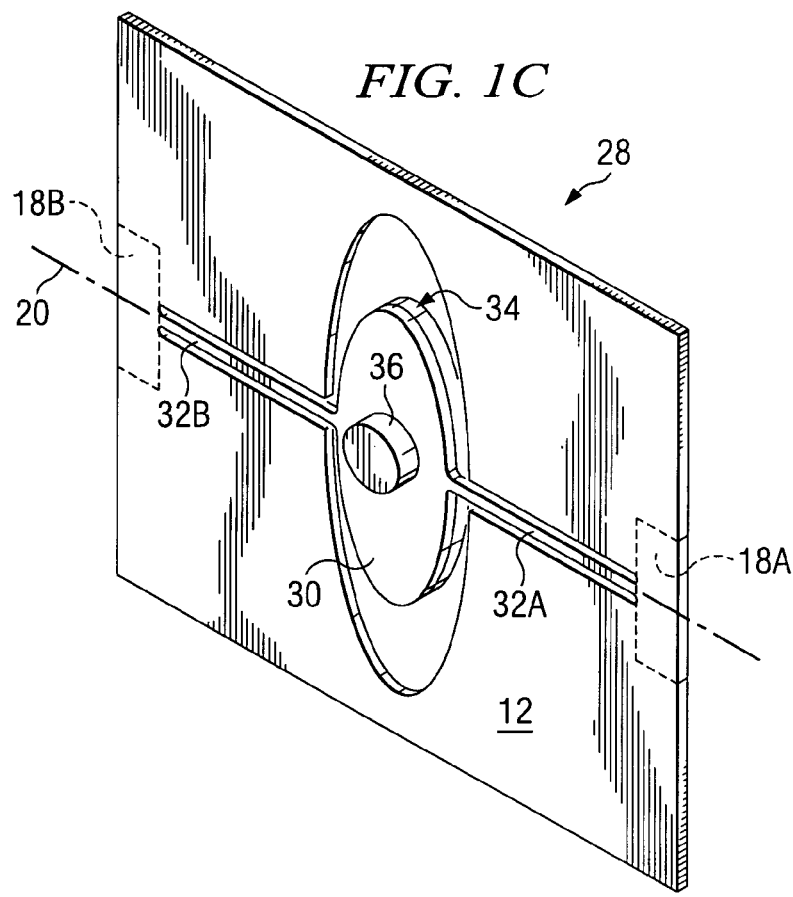

Referring to FIG. 1C, there is shown another example of a torsional hinged mirror suitable for use with this invention. As shown, there is an assembled view of a single axis multilayered device having a scanning mirror as the functional surface. This multilayered mirror solves the conflicting needs of flexible hinges and a rigid or flat mirror surface. As shown, the multilayered scanning structure comprises a support structure or hinge layer 28 having a front side and a back side for pivotally supporting attaching member 30 which is connected to an anchor member 12 by a pair of torsional hinges 32a and 32b. Anchor member 12 may be a frame as shown in the multilayered device of FIG. 1C. However, anchor member 12 could be replaced by a pair of anchor pads 18a and 18b as indicated by the dotted lines and as was discussed above with respect to FIGS. 1A and 1B. The functional layer or portion, such as mirror portion 34, is typically thicker than the hinge layer 28 and has a front reflecting surface and a back surface. The back surface is bonded or mounted to the front side of the attaching member 30 and a back layer or portion such as, for example only, permanent magnet 36, is bonded or mounted to the backside of the mirror attaching member 30. As shown, permanent magnet 36 is bonded along the axis 20 to the center of the backside of mirror attaching member 30. Permanent magnet 36 is considerably stiffer than the hinge layer 28 and mirror portion 34 and consequently stiffens and reinforces the structure in the middle area where the magnet is located. In addition, the mass moment of the permanent magnet 36 (mass moment of permanent magnet 36 is the mass of the permanent magnet 36 times the offset distance of the center mass of the permanent magnet 36 from axis 20) is selected to be substantially equal to and opposite the mass moment of the mirror portion 34 (mass of mirror portion 34 times the offset distance of the center of mass of mirror portion 34 from axis 20), such that the moment of inertia of the device is centered on the primary pivoting axis 20. The front layer, or mirror portion 34 and permanent magnet 36 of the assembled structure of FIG. 1C, add significant weight that must be supported by the torsional hinges 32a and 32b. However, if the entire front layer or mirror portion was made thick enough to maintain an acceptable level of flatness, the increased weight would be even greater, such that the hinges would likely be under excessive stress. This added stress due to such an increase in weight could result in unacceptable failure rates and short life.

If a device, such as a mirror, is to pivot or resonant at high-speed with minimal drive energy requirements and avoid excessive stress, engineering principles immediately suggest reducing the mass and weight of the oscillating device. However, reducing the mass of the device typically means thinning down the structure, and as discussed above, a thin structure also means a structure that is not as rigid (i.e., is flexible), and, as discussed above, a device, such as a mirror, that is too flexible is also unacceptable.

Figure 1D:
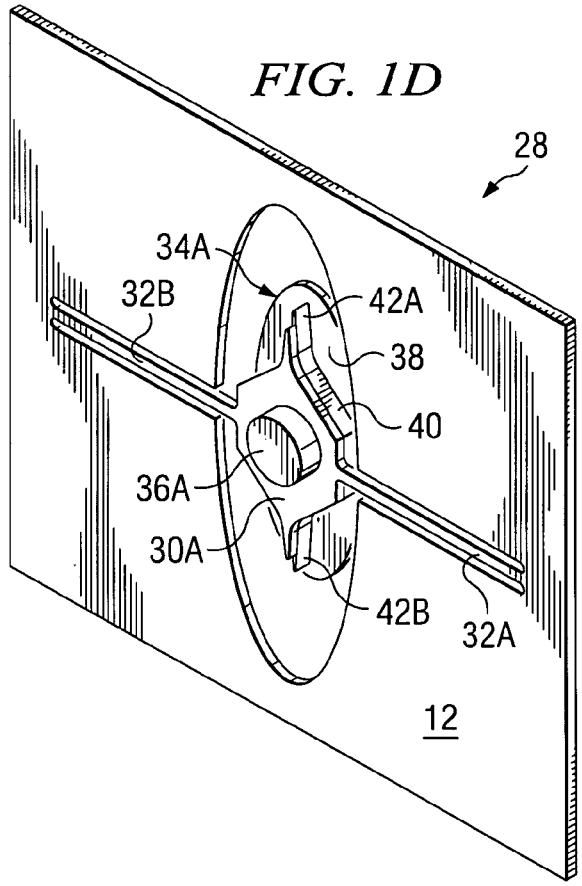

Therefore, referring to FIG. 1D and according to another embodiment of the invention, there is shown an assembled view representing an optimized multilayered resonant device having a mirror as the functional surface. The device of FIG. 1D has the same basic components as the device of FIG. 1C including mirror layer 34a. However, mirror layer 34a has a reflecting portion 38 with a first thickness and a back portion 40 defining at least one reinforcing ridge or member, such as for example, spines 42a and 42b that extend substantially to the edges or tips of the reflecting portion 38. Spines 42a and 42b are of course only examples, and the device could define two, three or more spines (not shown) extending from the hinge axis to the edges of the reflecting portion 38. Further, the spines or reinforcing ridges may have other shapes and may be formed by any suitable method such as controlled deposition or etching to remove excess material. Thus, the absence of material at large areas of the mirror layer 34a reduces weight and mass while the formed spines or reinforcing or stiffening members 42a and 42b help maintain a satisfactory degree of stiffness. Similarly, material may also be removed or etched from the attaching member 30a of the hinge layer 28 to define a shape that is similar and substantially matches the shape of the back portion 40 of the mirror layer 34a. Finally, the diameter of the rigid permanent magnet 36a may be increased and the thickness reduced to provide still more rigidity or stiffness to the structure in the hinge area. It will also be appreciated, as was the case in the embodiment of FIG. 1C, that the mass moment of the permanent magnet 36a (mass of magnet 36a times the offset distance of the center of the mass of magnet 36a from axis) is balanced with the mass moment of the mirror layer 34a (mass of mirror layer 34a times the offset distance of the center of the mass of mirror layer 34a from axis 20).

Figure 2A:
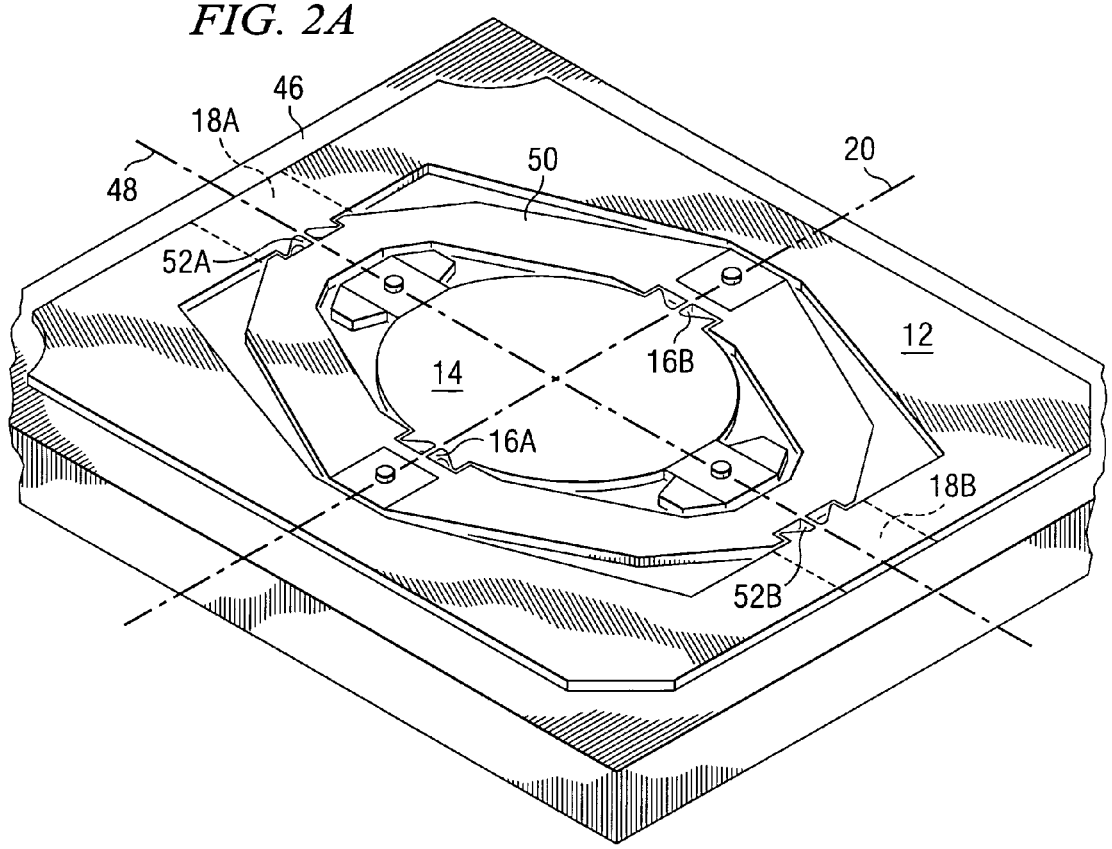
FIGS. 2A through 2C illustrate the embodiments of dual axis full torsional hinged mirrors that can also benefit from the present invention.
Figure 2B:
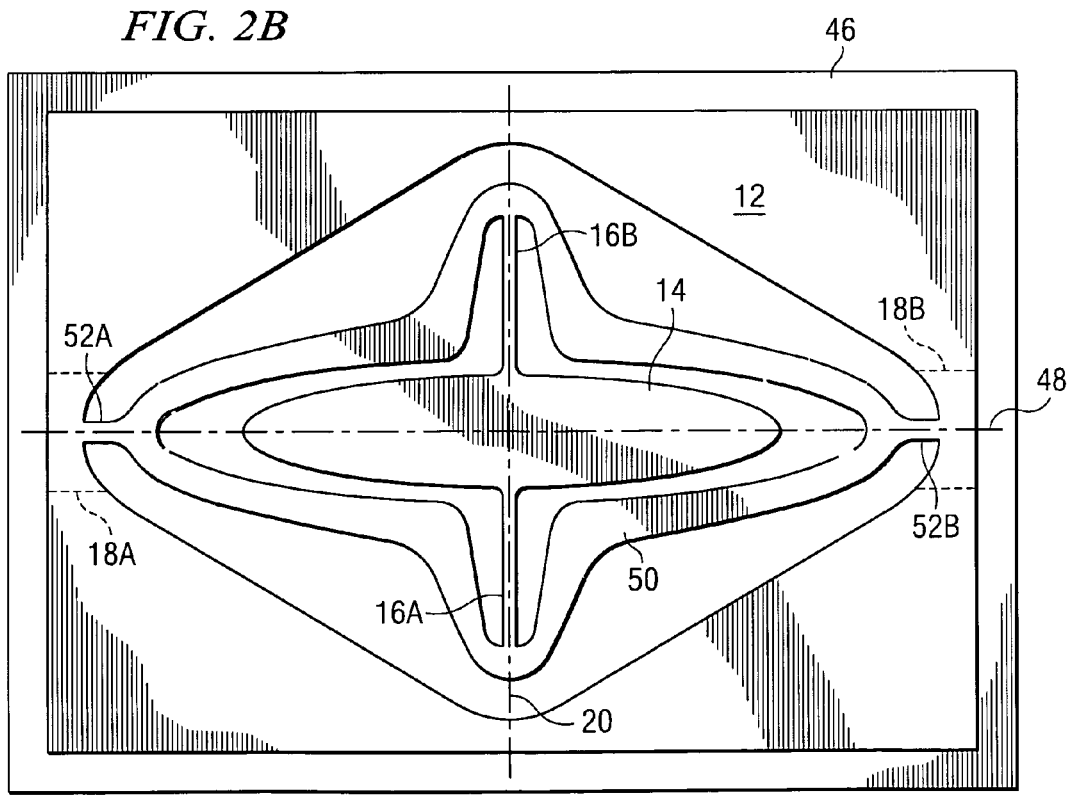

Referring now to FIGS. 2A and 2B, there is shown a perspective view and a top view, respectively, of two different embodiments of a dual axis of bi-directional device having a functional surface or mirror 14. Such dual axis mirrors may be used to provide a high-speed beam sweep wherein the high-speed beam sweep is also adjusted in a direction orthogonal to the beam sweep. When used as a scanning engine for a printer, adjusting the beam sweep orthogonally allows the printed image lines produced by a beam sweep in one direction and then in a reverse direction to be maintained parallel to each other. As shown, the assemblies of both FIGS. 2A and 2B are illustrated as being mounted on a support 46 and suitable for being driven along a second axis 48 as well as axis 20. As was discussed above with respect to single axis resonant devices, the mirror assembly may be formed from a substantially planar material and the functional or moving parts may be etched in the planar sheet of material (such as silicon) by techniques similar to those used in semiconductor art. As shown, the functional components include a support member or frame portion 12, similar to the single axis device. However, unlike the single axis device, the support structure of the dual axis device also includes an intermediate gimbals portion 50 as well as the functional surface such as mirror portion 14. It will be appreciated that the intermediate gimbals portion 50 is hinged to the support member or frame portion 12 at two ends by a pair of torsional hinges 52a and 52b spaced apart and aligned along axis 48. Except for the pair of hinges 52a and 52b, the intermediate gimbals portion 50 is separated from the frame portion 12. It should also be appreciated that, although support member or frame portion 12 provides an excellent support for attaching the device to support structure 46, it may be desirable to eliminate the frame portion 12 and simply extend the torsional hinges 52a and 52b and anchor the hinges directly to the support 46 as indicated by anchors 18a and 18b show in dotted lines on FIGS. 2A and 2B.

The inner, centrally disposed functional surface or mirror portion 14 is attached to gimbals portion 50 at hinges 16a and 16b along an axis 20 that is orthogonal to or rotated 90° from axis 48. The functional surface or mirror portion 14 for the embodiment shown is suitably polished on its upper surface to provide a specular or mirror surface. If desired, a coating of suitable material can be placed on the mirror portion to enhance its reflectivity for specific radiation wavelengths.

Figure 2C:
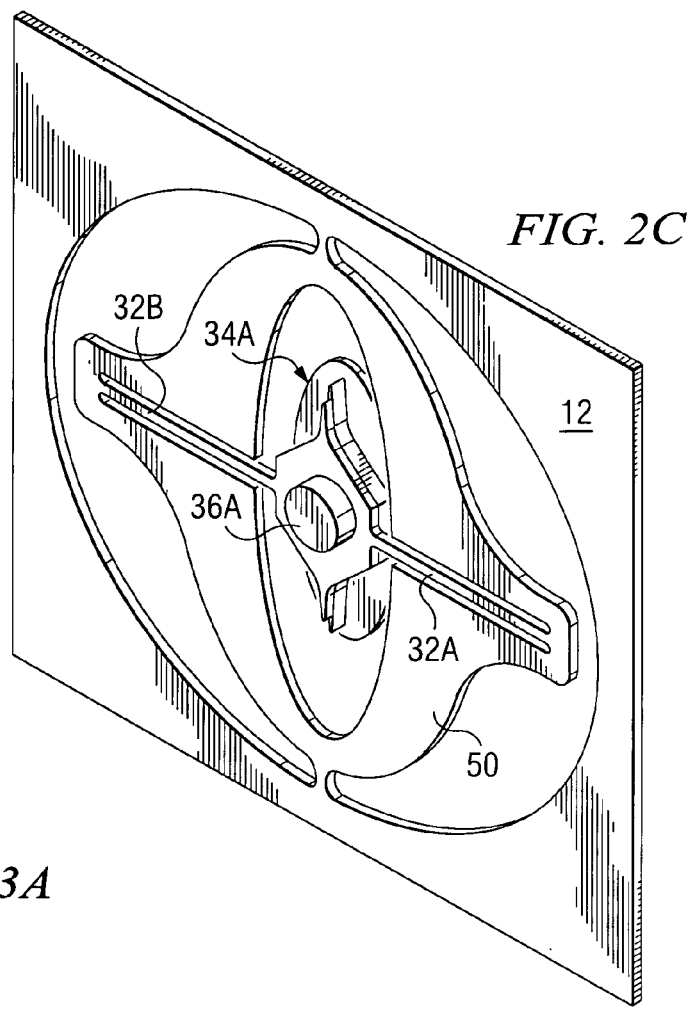

The embodiment of FIG. 2C is somewhat similar to the apparatus shown in FIG. 2B except it is multilayered and the mirror attaching member and the mirror portion or layer has been optimized by removing or etching excess material in the same manner as was discussed above with respect to FIG. 1D.

Figure 3A:
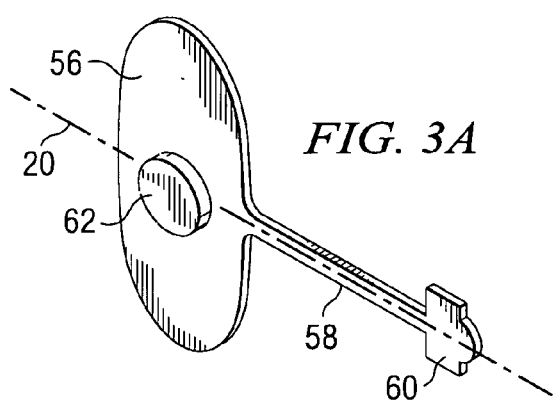
Figure 3B:
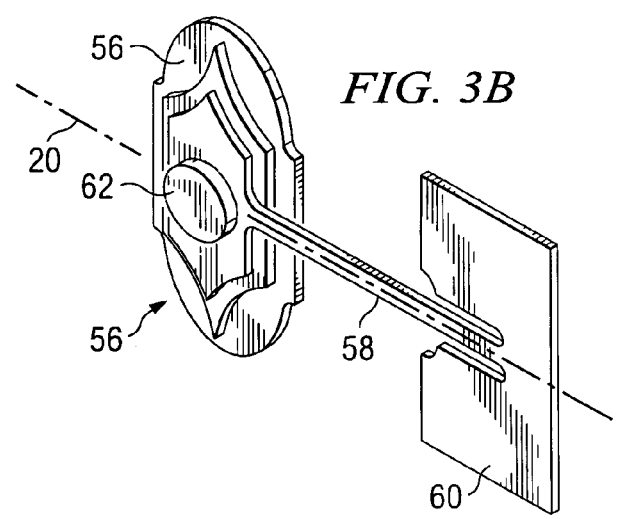

Referring now to FIGS. 3A through 3D, there are shown still other embodiments of a torsional hinge mirror that can benefit by incorporating the teachings of the present invention. As shown, FIGS. 3A and 3C are single layered structures and the embodiments of FIGS. 3B and 3D are multi-layered structures such as discussed above. As shown in FIGS. 3A and 3B, there is an elongated ellipse mirror portion 56 supported by a single torsional hinge 58. The other end of the torsional hinge is part of an anchor member 60. The anchor member 60 as was discussed heretofore, may include a complete frame around the mirror structure, or simply be an anchor pad as shown in both FIGS. 3A and 3B. Also included on the bottom side of the elongated ellipse portion 56, as illustrated by dashed line, is a single permanent magnet 62 for providing pivotal forces. Thus, as seen, the mirror structure of FIGS. 3A and 3B will pivot around pivot axis 20 on single torsional hinge 58 at a selected frequency, and preferably at the resonant frequency of the torsional mirror and hinge structure. Mirror structures similar to that shown in FIGS. 3A and 3B have been found to reach a resonant frequency and operate quite satisfactorily. However, as will be appreciated, because the mirror portion is supported as a cantilever member by the torsional hinge 58, the mirror is susceptible to forces in a plane perpendicular to the axis 20 of the mirror device. Consequently, as shown in FIGS. 3C and 3D, there are illustrated mirror structures substantially similar to those discussed with respect to FIGS. 3A and 3B. However, the embodiments shown in FIGS. 3C and 3D further include an axial member 64 extending along the selected axis and away from the mirror structure. As shown, the axial member 64 does not include another anchor pad but will be supported in a plane perpendicular to the axis as illustrated.

In the embodiment illustrated in FIG. 3C, the anchor pad 60 will be attached to a supporting structure (not shown) and the extreme end 66 of the axial member 64 may lay in a groove 69 on top of another portion 70 of the support member and then held in place via an axial hub or support member 72. Thus, the axial member 64 is free to rotate, but is substantially restrained from movement in a plane perpendicular to the selected axis 20.

It will also be appreciated by those skilled in the art that the support structure may simply comprise a hole or aperture 74 drilled into the support structure for receiving the extreme end of the axial member 64 such as shown in FIG. 3D.

Figure 4B:
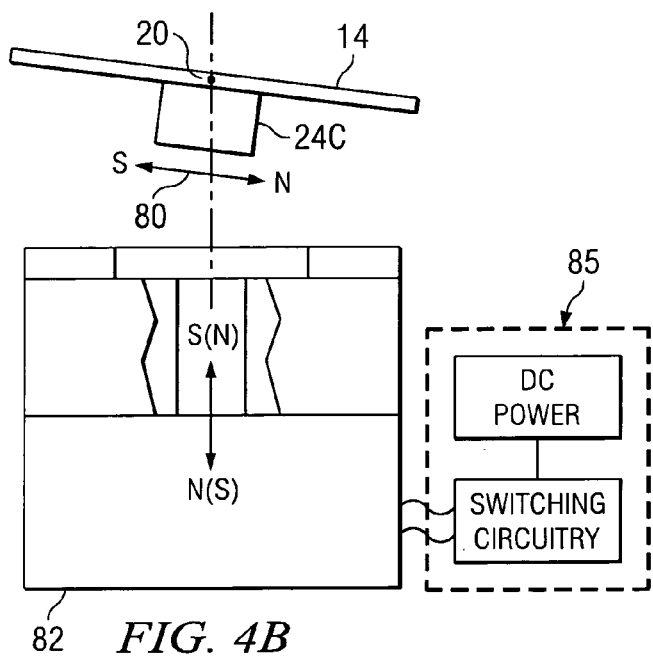
Figure 4C:
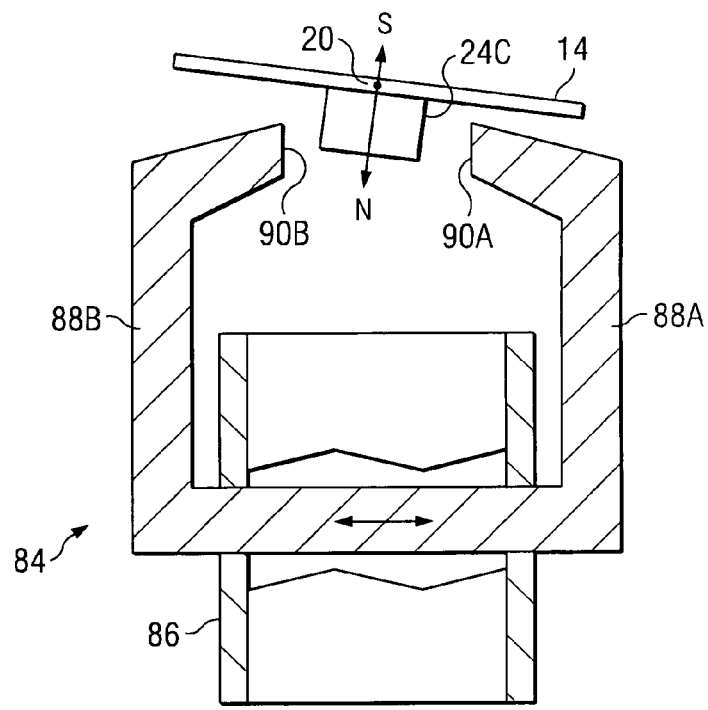

Various drive techniques have been used to generate the resonant frequency in torsional hinged devices, such as mirrors. Such drive techniques include magnetic, piezoelectric, etc. However, magnetic drives have been found to be particularly suitable. FIGS. 4A, 4B, and 4C illustrate three different magnetic drives that are particularly suitable for use with the present invention.

FIG. 4A is a schematic diagram illustrating how the resonant sweep and/or the orthogonal motion is controlled by electromagnetic coils 76a and 76b are driven by a power source 78. According to the prior art, power source 78 was an alternating voltage power source that provided a sine wave output. However, according to the present invention and as will be discussed in detail, the power source 78 is a single DC power source with a constant output that is periodically connected to and disconnected from the electromagnetic coils 76a and 76b by switching circuitry that is controlled by a series or train of pulses having a frequency substantially the same as the resonant frequency of the mirror. The permanent magnet sets 24a and 24b, such as discussed above with respect to FIGS. 1A and 2A, may be bonded to the mirror portion 14 (or gimbals member 50 shown in FIG. 2A) such that they cooperate with electromagnetic coils 76a and 76b. Thus, according to the prior art, the two coils 76a and 76b switched back and forth between north and south polarities at the resonant frequency such that, the permanent magnets 24a and 24b were alternately repelled and attracted to create the movement and/or resonant oscillation about axis 20. If the coil arrangement and magnet pairs were to provide orthogonal movement along axis 48 shown in FIG. 2A, a much slower frequency was used. Again according to the present invention and as will be discussed, properly timed single pulses of magnetic energy can also be used to maintain resonant oscillation.

Referring now to FIG. 4B, there is a simplified illustration of a pivoting mirror 14 and another coil and permanent magnet arrangement that significantly reduces the moment of inertia of the apparatus. As shown, the two permanent magnets have been eliminated and a single magnet 24c is centrally mounted on the pivoting mirror (such as shown in FIG. 2B). According to the embodiment shown in FIG. 4B, magnet 24C has a diametral charge that is perpendicular to the axis of rotation, as illustrated by double-headed arrow 80, rather than an axial charge. It will, of course, also be necessary to relocate the single drive coil 82 of the electromagnetic device so that it is substantially below magnet 24c. Therefore, according to the present invention, properly timed magnetic forces may be generated by the electromagnetic coil 82 by a train or series of electrical drive pulses applied across magnetic coil 82 thereby causing pivotal oscillations about axis 20. This is generally indicated by the combination power source and control circuitry having reference number 83.

FIG. 4C shows a second drive arrangement suitable for use with a single magnet centrally located. As shown, magnet 24c is axial charged in this embodiment instead of the diametral charged magnet of FIG. 4B. Further, the coil 82 shown in FIG. 4B is replaced by an electromagnetic arrangement 84, having a coil 86 and leg members 88a and 88b that extend from the coil 86 to tips 90a and 90b on each side of the magnet 24c. Thus, according to the prior art, an alternating current applied to coil 86 caused the magnetic field at the tips 90a and 90b of legs 88a and 88b to continuously change polarity. This change in polarity creates alternating push-pull forces on axial charged magnet 24c. However, according to the present invention, timed DC power pulses having calculated or selected duration are applied across the coil 86 as was discussed above.

Figure 5:
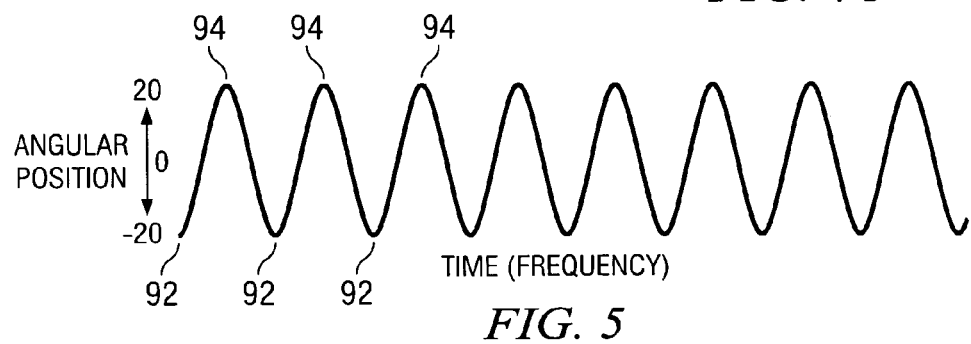
FIG. 5 is a graph illustrating the position of a torsional hinged mirror pivotally oscillating at its resonant frequency.
Figure 6:
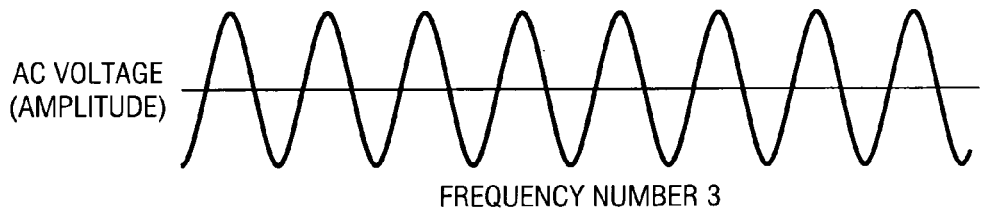
FIG. 6 illustrates the sine wave output drive signal of a prior art AC power supply applied to the electromagnetic coils for maintaining the torsional mirror oscillating at its resonant frequency.

More specifically in referring to FIG. 5, there is shown a graphic representation of the position of a resonant torsional hinge as it varies from a negative end point 92 (or zero speed) to a positive end point 94 (zero speed). The terms positive and negative end points are used only to provide a convenient reference for discussion. The graph of FIG. 5 illustrates eight complete oscillation cycles of such a torsional hinged mirror. FIG. 6 is a graph representing the prior art AC power source output signal applied across the magnetic coil(s) of the torsional hinged mirror to maintain the mirror at its resonant frequency. As can be seen, the frequency of the AC power source is at the resonant frequency of the mirror and is synchronized with the position of the oscillating mirror, though not necessarily in phase with it. As was discussed above, selecting the frequency of the AC power source to be the same as the resonant frequency of the mirror, allows minimal power to be used to maintain the mirror's resonant oscillations. The amplitude of the prior art AC drive signal was typically varied to control the sweep angle of the mirror while it was oscillating at its resonant frequency. As was discussed earlier, an AC power supply having a precise sine wave output frequency with an adjustable amplitude represented one of the more expensive components used to drive and maintain a torsional hinged mirror at its resonant frequency. Therefore, an effective but less expensive power source would be very advantageous.

Figure 7:
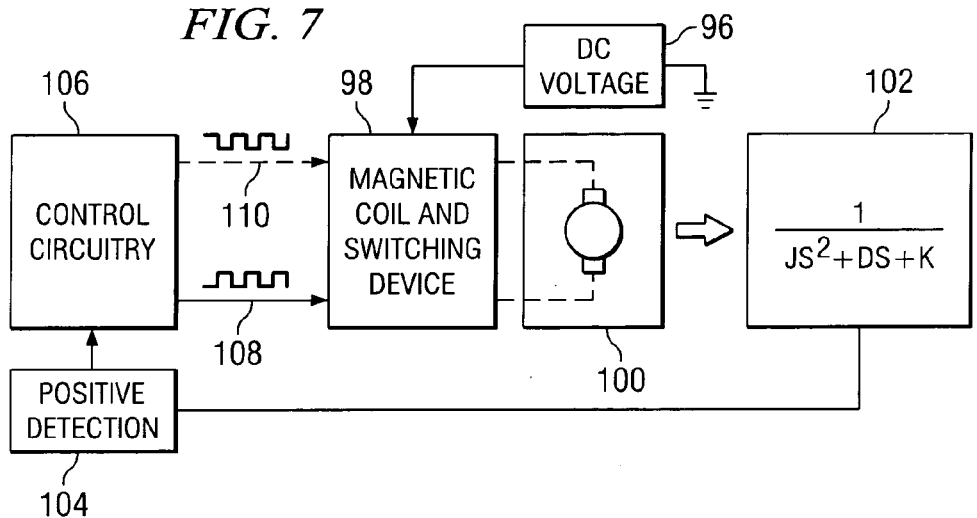
FIG. 7 is a simplified functional block diagram of the drive apparatus of the present invention.

Referring now to FIG. 7, there is shown a block functional diagram of the drive circuitry and apparatus of the present invention for maintaining a torsional hinged magnetic drive mirror at its resonant frequency. As shown, there is a power source 96 having a constant DC voltage output that is provided to the magnetic coil and switching circuitry 98 associated with the torsional hinged mirror. The magnetic coil of the torsional hinged mirror is repeatedly connected to and disconnected from the output of the DC power source 96 substantially synchronous with the oscillation of the torsional hinged mirror. The repeated connecting and disconnecting of the DC power source 96 and the magnetic coil, generates pulses of magnetic force that interact with the permanent magnet attached to the torsional hinged mirror. These generated magnetic force pulses are coordinated with the oscillating device to maintain the torsional hinged mirror oscillating at its resonant frequency.

The magnetic force on the torsional hinged mirror is functionally represented as the output of a "motor" 100 shown in FIG. 7. The resonant dynamics of the functional output of motor 100 is represented as $1/Js^2+Ds+k$ at element 102 of the functional diagram of FIG. 7. There is also included a sensor 104 that monitors the actual position of the pivoting mirror as it oscillates at its resonant frequency. The actual or monitored position as determined by sensor or position detector 104 is provided to control circuitry 106, which calculates the timing and duration of one or more pulse signals needed to generate the magnetic energy pulses necessary to maintain resonant oscillation of the mirror. More specifically, the magnetic energy pulses also maintain the mirror oscillations at a suitable amplitude such that the resonant beam sweep of the mirror covers a suitable angular movement or travel. Therefore, as shown, the series of output pulses are then provided on line 108 to control the switching portion of the circuitry 98, which, as mentioned above, controls the connecting and disconnecting of power to and from the DC power source 96. As will be discussed in detail hereinafter, a single train or series of pulses may be provided by control circuitry as shown on line 108, or alternately there may be a second train or series of pulses provided on dotted line 110 that are phase shifted 180°.

Figure 7A:
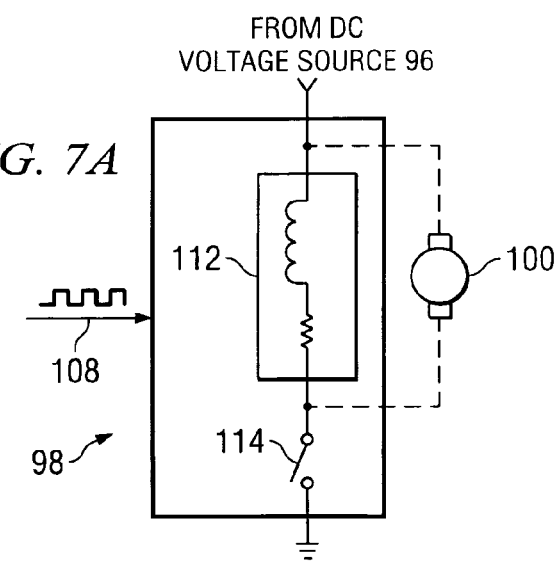
FIG. 7A illustrates switching circuitry used in the drive apparatus of FIG. 7 for providing a single drive pulse applied to either the "positive" or "negative" end position of the resonant oscillation cycle according to a first embodiment of the present invention.
Figure 8A:
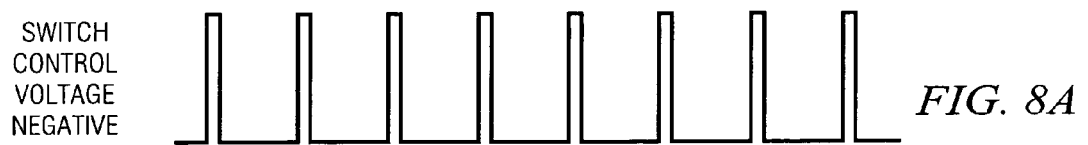
FIGS. 8A–8E show a series of graphs illustrating various parameters associated with the pulse drive apparatus of FIG. 7A.
Figure 8B:
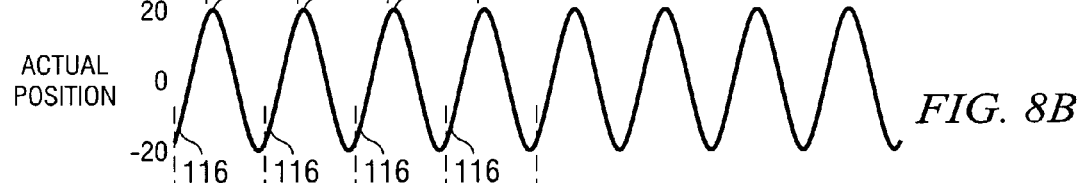
Figure 8C:
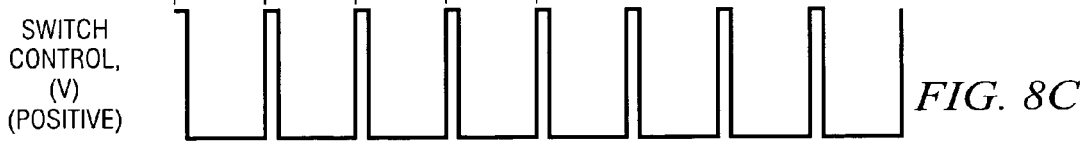
Figure 8D:
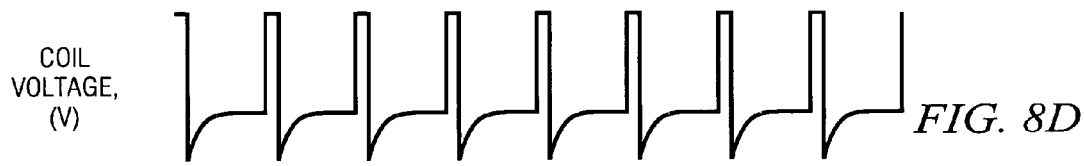
Figure 8E:

Referring now to FIG. 7A along with graphs of FIGS. 8A, 8B, 8C, 8D, and 8E, there is illustrated a first embodiment of the magnetic coil and switching circuitry 98 according to the present invention. As shown, DC voltage source 96 is connected across the magnetic coil 112 and electrical switch 114. Electrical switch 114 periodically connects and disconnects the current flow through coil 112 in response to the train or series of pulses provided on line 108. As discussed above, the pivoting mirror is represented functionally as a motor 100 connected by dotted lines. More specifically, referring to FIG. 8B there is again illustrated a graph representing the position of a torsional hinged mirror pivotally oscillating at its resonant frequency. FIG. 8C represents the timing and duration of the series of controlled pulses on line 108 used to operate switch 114. As can be seen, according to the illustrated embodiment, there is provided one single positive control pulse that occurs at the beginning point 116 of each oscillation cycle. FIG. 8D illustrates the voltage that occurs across the coil 112 in response to switch 114 closing, and FIG. 8E illustrates the corresponding current flowing through the coil. Therefore, since a magnetic field will be created when the current represented in FIG. 8E flows through the magnetic coil, it will be appreciated that the torsional hinged mirror, oscillating at its resonant frequency, will receive a burst of magnetic energy synchronous in time and duration with the pivoting mirror so that the resonant oscillations are maintained.

It should also be appreciated, however, that a resonant oscillation of the torsional hinged mirror could also be maintained if a single pulse was received only once during a multiplicity of cycles, such as for example only, every other cycle rather than every cycle. There would be a slight decrease or decay in the position amplitude (or angular sweep) of the mirror, but so as long as the total angular sweep of the mirror did not decrease below a selected threshold value, the mirror drive arrangement would still operate satisfactorily. Similarly, therefore, it will be appreciated that the signal pulses could be provided every third or every fourth or any other selected multiple of oscillation cycles so long as the angular sweep of the mirror did not drop below the pre-selected value. It will also further be appreciated that the signal pulses could even be produced "on demand only" such that when the sweep amplitude decreases below a selected threshold, the power supply 96 provides a pulse. Of course, since the mirror is oscillating at resonance, the "on demand only" would still be substantially periodic unless the oscillating mirror somehow experienced variable loading.

According to the embodiment described above, power supply 96 provided a positive output such that a positive voltage pulse was connected across the magnetic coil 112 at the start point 116 of the "positive" portion of the oscillation cycle. However it will be appreciated by those skilled in the art that according to another embodiment, the output of the power source 96 could be a negative voltage. Therefore, referring again to FIG. 8B, it is seen that the timing of the energy pulse could occur at point 118 representing the end point of the positive portion of the cycle and the beginning point of the negative portion of the cycle. This pulse, phase shifted 180° as shown in FIG. 8A, occurs at point 118 of the oscillation cycle and provides a "negative" or reverse magnetic drive force or pulse to maintain the mirror at resonant oscillations. The coil voltage and coil current for the negative pulse are not shown but would be the reverse of FIGS. 8D and 8E. Again, as was discussed above an energy pulse may not be required at each oscillation cycle. That is, only a single negative energy pulse could also be provided over a selected multiplicity of cycles or only on demand when the sweep amplitude decreases below a selected value.

As was discussed above, either positive or negative energy pulses could be used to maintain the torsional hinged pivoting mirror oscillating at its resonant frequency. Therefore, it should also be appreciated that both negative and positive magnetic energy pulses could be applied to the oscillating mirror to maintain resonant frequency oscillations.

Figure 7B:
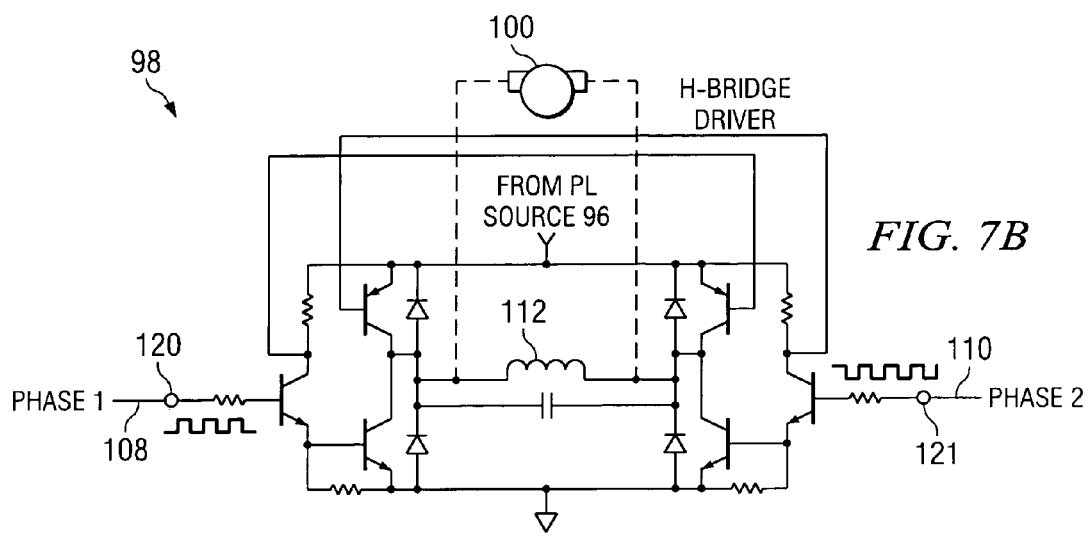
FIG. 7B illustrates another embodiment of switching circuitry suitable for use in the drive apparatus of FIG. 2 for providing a drive pulse to both the "positive" and "negative" end positions of the oscillation cycle.
Figure 9A:
FIGS. 9A–9G show a series of graphs illustrating various parameters associated with the drive apparatus of FIG. 7B.
Figure 9B:
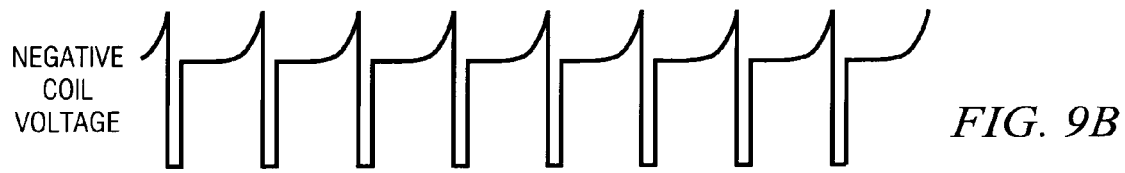
Figure 9C:
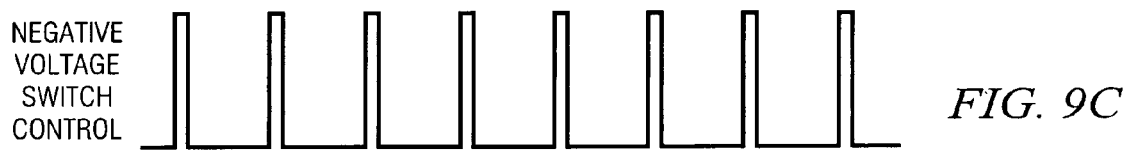
Figure 9D:
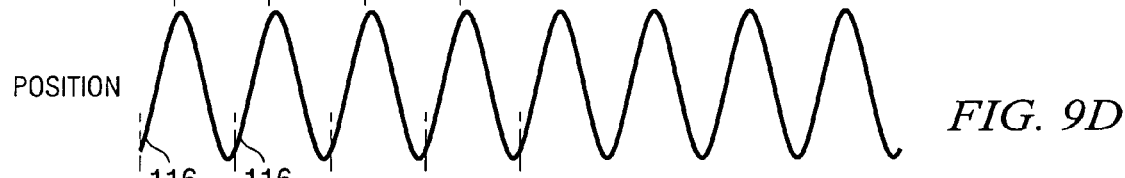
Figure 9E:
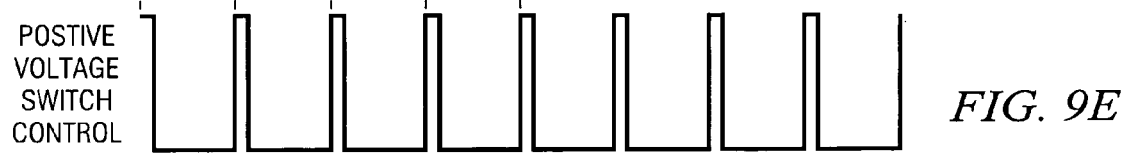
Figure 9F:
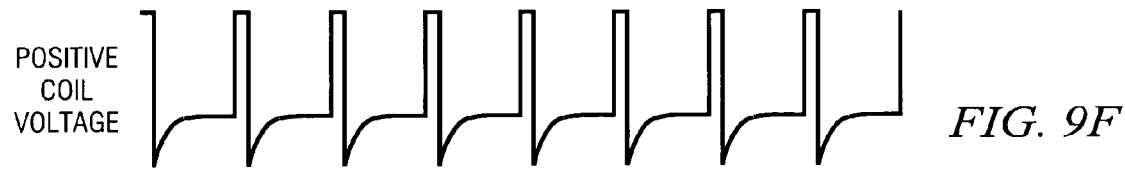
Figure 9G:
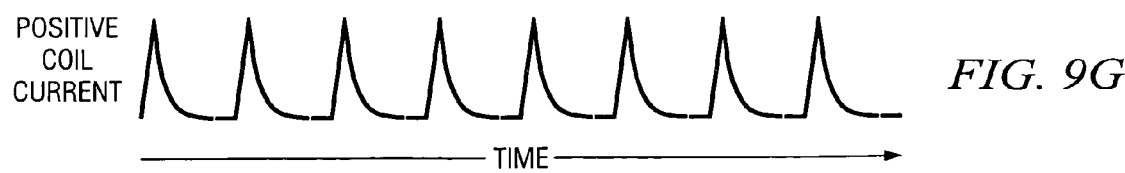

Therefore, referring to FIG. 7B along with FIGS. 9A through 9G, there is illustrated still another embodiment of the present invention that provides drive energy pulses to the resonant mirror. As shown in FIG. 7B there is a first series of electrical control pulses received at the phase 1 input 120 on line 108. There is also a second series of control pulses that are phase shifted from the first series of pulses by 180° provided to the phase 2 input 120 from line 110. As will be appreciated by those skilled in the art, the circuitry of FIG. 7B is a H-Bridge drive that will alternately provide positive and negative electrical pulses across the magnetic coil 112 of the torsional hinged mirror in response to the first and second pulse trains received at the phase 1 and phase 2 inputs. As before, the torsional hinged mirror is represented by motor 100 connected by dotted lines. The graphs of FIG. 9A through 9G are similar to the graphs discussed with respect to FIGS. 8A through 8E except the graphs of FIGS. 9A through 9C show the 180° phase shifted pulse train and the corresponding negative coil voltage and coil current. FIG. 9D shows the position of the oscillating mirror, and FIGS. 9E through 9G show the pulse train and the corresponding positive coil voltage and coil current.

Although the above discussion is specific to operating the scanning mirror at resonance, the present invention is also applicable to driving the mirror at a frequency slightly above or below its resonant frequency. By adjusting the pulse width, a constant scan velocity can be maintained, even though the mirror is not at its resonant frequency.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, circuits, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. Apparatus for establishing and maintaining oscillations of a torsional hinged device comprising:

a torsional hinged device adapted for pivoting about an axis and having at least one permanent magnet attached thereto;

at least one electromagnetic coil for generating a magnetic field that interacts with said at least one permanent magnet to create a magnetic force that causes said device to pivot about said axis;

an electrical power source having a selected output DC voltage;

a source of switching signals; and switching circuitry for electrically connecting and disconnecting said power source and said electromagnet coil in response to said switching signals to provide a series of DC pulses to said at least one electromagnetic coil;

a position detector for monitoring the pivot position of said torsional hinged device and for providing a signal representative thereof; and a control circuit for receiving said signal indicative of said pivot position and for generating a series of said switching signals.

2. The apparatus of claim 1 wherein said control circuit determines the timing and duration of said series of switching signals.

3. The apparatus of claim 1 wherein said torsional hinged device oscillates at its resonant frequency.

4. The apparatus of claim 2 wherein said control circuitry generates a single switching signal during each oscillation cycle.

5. The apparatus of claim 2 wherein said control circuitry generates a single switching signal only one time during a selected multiplicity of oscillation cycles.

6. The apparatus of claim 2 wherein said control circuitry generates a switching signal on demand when the angular movement of the oscillating mirror falls below a pre-selected threshold.

7. The apparatus of claim 5 wherein said control circuitry generates a single switching signal every other oscillation cycle.

8. The apparatus of claim 2 wherein said torsional hinged device oscillates at its resonant frequency and said control circuitry calculates selected parameters of said oscillating device to generate said switching signals periodically to maintain said resonant oscillating device with selected limits.

9. The apparatus of claim 2 wherein said control circuitry generates two switching signals during an oscillation cycle such that said switching circuitry provides both a positive DC signal and a negative DC signal for each oscillation cycle.

10. The apparatus of claim 9 wherein said control circuitry generates two said switching signals only once during a selected multiplicity of oscillation cycles.

11. The apparatus of claim 9 wherein said torsional hinged device oscillates at its resonant frequency and said control circuitry calculates selected parameters of said oscillating device to periodically generate said two switching signals to maintain said resonating oscillating device within selected limits.

12. The apparatus of claim 9 wherein said control circuitry generates said two switching signals on demand when the angular movement of the oscillating mirror falls below a pre-selected threshold.

13. The apparatus of claim 1 wherein said torsional hinged device comprises a full hinge torsional hinged device.

14. The apparatus of claim 1 wherein said torsional hinged device comprises a half hinge torsional hinged device.

15. The apparatus of claim 1 wherein said at least one permanent magnet comprises a pair of permanent magnets positioned on each side of said axis and wherein said at least one magnetic coil comprises a pair of serially but reverse connected magnetic coils positioned one each proximate each magnet of said pair of permanent magnets.

16. The apparatus of claim 1 wherein said at least one permanent magnet is a single permanent magnet located on said pivot axis.

17. The apparatus of claim 9 further comprising an H-Bridge Drive for providing said positive and negative pulses.

18. The apparatus of claim 10 further comprising an H-Bridge Drive for providing said positive and negative pulses.

19. Drive circuitry for establishing and maintaining oscillations of a torsional hinged device having at least one permanent magnet attached thereto, said drive circuitry comprising:

at least one electromagnetic coil for generating a magnetic field that interacts with said at least one permanent magnet to create a magnetic force that causes said device to pivot about said axis;

an electrical power source having a selected DC output voltage; and switching circuitry for electrically connecting and disconnecting said power source and said electromagnetic coil in response to switching signals for providing a series of DC voltage pulses to said at least one electromagnetic coil.

20. The drive circuitry of claim 19 further comprising control circuitry for receiving a signal indicative of the position of said torsional hinged device, and generating a series of said switching signals to maintain oscillating movement of said torsional hinged device.

21. The drive circuitry of claim 20 wherein said control circuit determines the timing and duration of said series of switching signals.

22. The drive circuitry of claim 19 wherein said torsional hinged device pivotally oscillates at its resonant frequency.

23. The drive circuitry of claim 22 wherein said control circuitry generates a single switching signal during each oscillating cycle.

24. The drive circuitry of claim 22 wherein said control circuitry generates a single switching signal only one time during a selected multiplicity of oscillating cycles.

25. The drive circuitry of claim 22 wherein said control circuitry generates a switching signal on demand when the angular movement of the oscillating mirror falls below a pre-selected threshold.

26. The drive circuitry of claim 20 wherein said torsional hinged device oscillates at its resonant frequency and said control circuitry calculates selected parameters of said oscillation device to generate switching signals to maintain said resonant oscillating device within selected limits.

27. The drive circuitry of claim 20 wherein said control circuitry generates two switching signals that are phase shifted 180° during selected oscillation cycles such that said switching circuitry provides both a positive force pulse and a negative force pulse for each selected oscillation cycle.

28. The drive circuitry of claim 27 wherein said two switching signals are generated every oscillation cycle.

29. The drive circuitry of claim 27 wherein said two switching signals are generated every other oscillation cycle.

30. The drive circuitry of claim 27 further comprising an H-Bridge Drive for providing said positive and negative force pulses.

31. A method for establishing and maintaining a torsional hinged device at resonant oscillations comprising the steps of:

providing a torsional hinged device having at least one permanent magnet mounted thereon and adapted for pivoting about an axis;

providing a series of timing signals;

periodically connecting and disconnecting a power source to an electromagnetic coil located proximate said at least one permanent magnet in response to said series of timing signals; and generating a magnetic field at said electromagnetic coil that interacts with said permanent magnet mounted on said torsional hinged device to pivotally oscillate said torsional hinged device about said axis at said resonant frequency;

monitoring the position of said oscillating torsional hinged device and generating a signal indicative thereof;

receiving said signal indicative of said oscillating hinge device and calculating oscillation parameters of said device; and generating said timing signals such that magnetic forces resulting from said interaction between said at least one permanent magnet and said electromagnetic coil maintains said resonant frequency of said device.

32. The method of claim 31 wherein said step of calculating the parameter of said switching signals comprises calculating the timing and duration of said electrical pulses.

* * * * *